United States Patent [19]

Hamada

[11] 4,059,807
[45] Nov. 22, 1977

[54] PULSE WIDTH MODULATED AMPLIFIER

[75] Inventor: Osamu Hamada, Tokyo, Japan

[73] Assignee: Sony Corporation, Tokyo, Japan

[21] Appl. No.: 626,823

[22] Filed: Oct. 29, 1975

[30] Foreign Application Priority Data

Nov. 2, 1974 Japan .................................. 49-126802

[51] Int. Cl.² .............................................. H03F 3/38
[52] U.S. Cl. ........................................ 330/10; 330/75;
330/207 A
[58] Field of Search ............. 329/106; 330/10, 207 A,
330/75; 332/9, 10

[56] References Cited
U.S. PATENT DOCUMENTS

| 3,336,538 | 8/1967 | Crowhurst | 330/207 AX |
| 3,585,517 | 6/1971 | Herbert | 330/10 |
| 3,845,402 | 10/1974 | Nupp | 330/10 |

Primary Examiner—Lawrence J. Dahl
Attorney, Agent, or Firm—Hill, Gross, Simpson, Van Santen, Steadman, Chiara & Simpson

[57] ABSTRACT

A pulse width modulation circuit which comprises a mixer for combining an input audio signal with a feedback signal and for developing a difference signal to feed to an integration circuit. The integration circuit is coupled to a pulse width modulator which has a sawtooth carrier input for modulating the input audio signal. The resulting pulse modulated signal is then fed to a pulse amplifier and a low-pass filter and finally to a load. The output of the low-pass filter is coupled back to the mixer.

5 Claims, 2 Drawing Figures

PULSE WIDTH MODULATED AMPLIFIER

BACKGROUND OF THE INVENTION

1. Field of the Invention

The field of art to which this invention pertains is a novel pulse width modulated amplifier circuit and in particular to such a circuit which utilizes an integration circuit for eliminating carrier distortion and undesirable oscillations.

2. Description of the Prior Art

Generally, an audio amplifier, particularly a Class-B amplifier comprises a pair of transistors having their respective bases connected to both ends of the secondary winding of a transformer having a center tap input. The emitters of each of said transistors are connected to both ends of the primary winding with a center tap output. The center tap is connected to one end of the power source, and the other end of the power source is connected to the collectors of the transistors. The input signal is applied to both ends of the primary winding of the transformer, while the output signal is extracted from the secondary winding. Such an amplifier is widely used since it is simple in design and low in cost, but this amplifier has low efficiency. This is due to the fact that an unnecessary voltage is applied to one of the two transistors. As is well known, transistors have no capacity to accumulate energy and hence consume the power equal to the product of its voltage and load current.

There have already been proposed various types of pulse width modulated amplifiers (hereinafter referred to as PWM amplifiers) which utilize the power source voltage more effectively than the above low-efficiency amplifiers. Among such known PWM amplifiers is a self oscillation type. This type of amplifier consists of an integration circuit, a hysteresis circuit, an amplifier, and a circuit which picks up the difference between the amplifier output and input signal and feeds the difference signal to said integration circuit. This type of amplifier oscillates without an outside carrier, but it has the defect that the oscillation frequency varies according to the frequency of the input signal and that the sideband of the spectrum interferes with the audio signal to distort the reproduced sound. Another type of PWM amplifier is known in which a square wave is obtained by comparing the carrier signal from the reference oscillation source with the input signal. Such square wave is fed back to the signal input terminal through a low-pass filter. This type of amplifier, however, is high in carrier signal frequency, and the low-pass filter is unable to remove the carrier sufficiently, so that there is the danger that the loop will oscillate in the frequency range of the carrier signal. If the cut-off frequency of the low-pass filter is lowered enough to eliminate carrier signal, it may follow that no satisfactory loop gain is obtained in the audio signal. Also, if the carrier is not sufficiently removed, the side bands may mix with the demodulated signal to distort the reproduced audio.

SUMMARY OF THE INVENTION

The present invention relates to a pulse width modulated (PWM) amplifier in which the duty cycle of the output pulse is proportional to the audio input signal level as well as to the pulse area, in which an undistorted demodulation output can be obtained. The PWM amplifier according to the present invention comprises an integration circuit to which a difference signal between input and feedback signals is fed, a pulse width modulator which receives the output of said integration circuit and carrier signal, a low-pass filter, and a circuit whereby the output of said low-pass filter is fed back to be mixed with the audio input.

An object of the present invention is to provide a novel PWM amplifier.

Another object of the present invention is to provide a PWM amplifier as described above wherein a sufficiently high gain is obtained for the audio signal frequencies so as to eliminate distortion in the reproduced sound.

Still another object of the present invention is to provide a PWM amplifier as described above which is not subject to oscillations due to the feedback signal.

Other objects and advantages of the present invention will become apparent from the following detailed description of a preferred embodiment taken in conjunction with the accompanying drawings.

DESCRIPTION OF THE PREFERRED EMBODIMENT

The present invention relates to a novel pulse width modulation circuit which utilizes the combination of a sawtooth modulating carrier and an integration circuit connected in series with the signal path containing the difference signal between the audio input and a feedback signal.

By the use of this arrangement, any carrier present in the signal path is integrated and eliminated.

Figure 1:
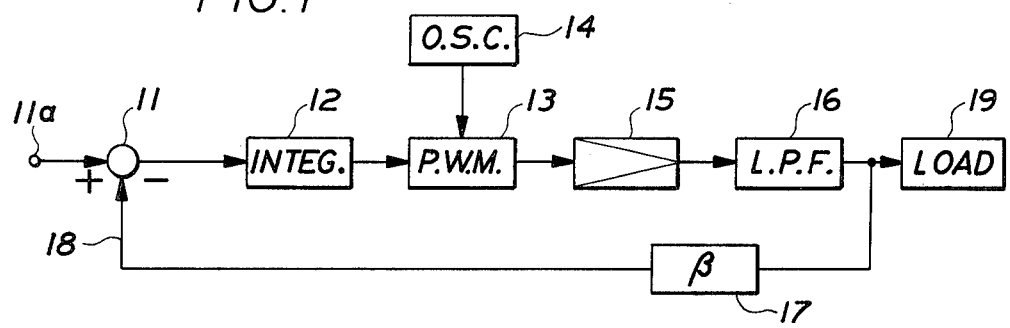
FIG. 1 is a block diagram showing a pulse width modulated amplifier circuit according to the present invention.

Referring to FIG. 1, an input signal is supplied to a mixer 11 from an input terminal 11a. A feedback signal is also supplied to the circuit 11 from a feedback circuit 17 and the difference of said input and feedback signals is derived at the output end of the circuit 11. The output of the input circuit 11 is fed to an integration circuit 12, and an integration signal expressed by the following formula is produced at the output of the integration circuit.

$$\Delta V = \int (e_i - e_f) dt$$

where:
$e_i$ = input voltage
$e_f$ = feedback voltage
$\Delta V$ = output voltage of the integration circuit.

Figure 2:
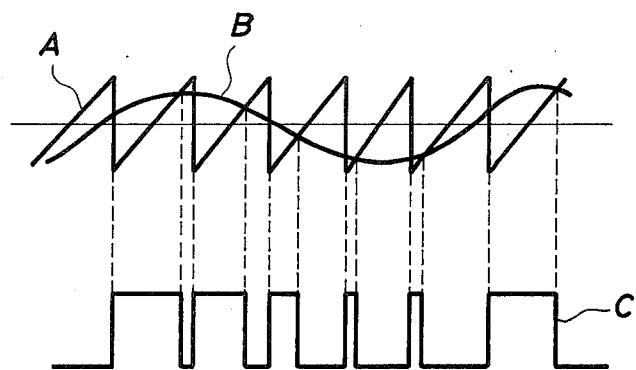
FIG. 2 is a diagram showing the relationship between the wave forms of carrier A, input signal B and output pulse C of the circuit of FIG. 1.

The integrated output is supplied to a pulse width modulator 13 which includes a comparison circuit. A sawtooth signal (for example, a 100KHz carrier) is developed in an oscillator 14, and is supplied to the modulator 13 where the output signal of the integration circuit 12 and said sawtooth signal (carrier) are compared in level. For instance, the output of the comparator is inverted in phase every time the output of the integration circuit 12 becomes equal to the voltage of the sawtooth signal 14, and the duty cycle of the output of the modulator 13 varies according to the output voltage of the integration circuit 12. This process is shown by a time chart in FIG. 2 where the sawtooth carrier signal is identified as "A" and the output signal from the integration circuit 12 is identified as "B". It will be noted that the output of the PW modulator 13 increases to a point where the signals A and B are the same level, in the course of a change of signal A from a higher to a lower level, and the PW modulator maintains a constant output. On the other hand, the output of the PW modulator 13 decreases sharply when the signals A and B are the same level, in the course of a change of the signal A from a lower to a higher level. In this way, signals A and B are compared in level, and as a result, the audio input signal to the circuit 11 is converted to a pulse width modulated signal as shown by waveform C in FIG. 2. Waveform C is amplified by pulse amplifier 15 and then supplied to a low-pass filter for removing high frequency components. The signal is converted by this filter 16 into an audio signal and supplied to a load 19. The output of the low-pass filter 16 is also supplied to a feedback circuit 17 which may comprise a resistor, and the feedback signal is coupled back to the input circuit 11.

According to the present invention, even if the carrier signal which has not been sufficiently eliminated by the low-pass filter 16 should be present in the feedback signal, such signal is integrated by the integration circuit 12, so that it is substantially removed prior to the PW modulator 13. It is therefore possible to provide a sufficiently large loop gain for the input audio signal in the audio frequency band (for example less than 20KHz) which is a sufficiently lower frequency than that of the carrier signal, and hence the merit of the negative feedback, namely the elimination of distortion according to the present invention can be realized.

Further according to the PWM amplifier of the present invention, since a sawtooth signal is used as the carrier from the oscillator 14, and such signal is compared in level with the audio input signal, the level of the audio input signal coincides with the duty cycle of the PW modulator 13, and such duty cycle is proportional to the pulse area, so that the demodulation signal from the low-pass filter is free from distortion. Also, the carrier component in the feedback signal 18 is reduced by integration to eliminate the influence of the residual carrier at the time of modulation by the PW modulator 13, and hence there is no interference with the audio signal. Furthermore, the feedback signal usually has a certain phase delay in the loop due to the presence of the low-pass filter 16 or other such means and oscillations takes place when such phase delay reaches 180°, but since the phase delay of the integration circuit 12 is always 90°, there is no chance of oscillations by incorporation of the integration circuit 12. Also, this pulse width modulated amplifier causes no variation of frequency and is capable of minimizing distortion.

I claim as my invention:

1. A pulse width modulated amplifier circuit comprising:
    a mixer having audio and feedback inputs and an output,
    means for integrating a signal derived from said output,
    means for pulse width modulating a signal derived from an output of said integrating means,
    means for filtering said pulse width modulated signal and for applying said filtered signal to a load, and
    means for feeding back a portion of said filtered signal to said mixer,
    said integrating means eliminating any modulating signal from the feedback from passing to said pulse width modulating means.

2. A pulse width modulated amplifier circuit in accordance with claim 1 wherein said pulse width modulating means comprises means for developing a sawtooth wave and for using said sawtooth wave to modulate said signal derived from the output of said mixer.

3. A pulse width modulated amplifier circuit in accordance with claim 2 wherein said filtering means comprises a low-pass filter and wherein means are provided to amplify said pulse width modulated signal between said pulse width modulator and said filtering means.

4. A pulse width modulated amplifier circuit comprising:
    an input circuit,
    an integration circuit for integrating a signal derived from the output of said input circuit,
    a pulse width modulator and means for feeding thereto a carrier signal and said output signal from said integration circuit,
    said pulse width modulator producing a signal having a pulse width which corresponds to the level of the output signal from said integration circuit,
    a low-pass filter connected to the output of said modulator, and
    a feedback circuit connected to the output of said low-pass filter to feedback the output of said low-pass filter to said input circuit,
    said integrating means eliminating any modulating signal from the feedback from passing to said pulse width modulating means.

5. A pulse width modulated amplifier circuit in accordance with claim 4, wherein an amplifier is provided between said pulse width modulator and said low-pass filter, and the carrier signal supplied to said pulse width modulator is a sawtooth signal.

* * * * *